(12) United States Patent
Yaung et al.

(10) Patent No.: US 6,372,603 B1
(45) Date of Patent: Apr. 16, 2002

(54) PHOTODIODE WITH TIGHTLY-CONTROLLED JUNCTION PROFILE FOR CMOS IMAGE SENSOR WITH STI PROCESS

(75) Inventors: Dun-Nian Yaung, Taipei; Shou-Gwo Wuu, Hsinchu Hsien; Chien-Hsien Tseng, Hsinchu, all of (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/612,186

(22) Filed: Jul. 7, 2000

(30) Foreign Application Priority Data

Mar. 17, 2000 (TW) .......................................... 89104901

(51) Int. Cl.[7] .................. H01L 21/76; H01L 21/302; H01L 29/788; H01L 29/76
(52) U.S. Cl. .................. 438/424; 438/425; 438/426; 438/427; 438/437; 438/692; 438/696; 257/315; 257/319
(58) Field of Search .................. 438/57, 424, 228, 438/426, 425, 427, 296, 437, 692, 696, 702; 257/354, 315, 319

(56) References Cited

U.S. PATENT DOCUMENTS 6,001,706 A * 12/1999 Tan et al. .................. 438/424
6,107,143 A * 8/2000 Park et al. .................. 438/296
6,274,907 B1 * 8/2001 Nakagawa .................. 257/354

* cited by examiner

Primary Examiner—Matthew Smith
Assistant Examiner—V. Yevsikov
(74) Attorney, Agent, or Firm—Darby & Darby

(57) ABSTRACT

A method for forming a high performance photodiode with tightly-controlled junction profile for CMOS image sensor with STI process. The following steps are performed: providing a substrate; forming a hard mask layer for defining a pattern on the substrate; etching the substrate on the surface of the substrate not covered by the hard mask layer to form a shallow trench; growing an oxide lining in the shallow trench by a thermal oxidation process; performing a first thermal annealing; defining an n-well region in the shallow trench; implanting the n-well region; performing a second thermal annealing; forming a silicon oxide layer on the substrate to fill in the shallow trench; removing a portion of the silicon oxide layer on the substrate such that the portion in the shallow trench remains; removing the hard mask layer; and forming a transistor on the substrate, wherein the transistor comprises a gate structure, a source region, and a drain region.

5 Claims, 4 Drawing Sheets

PHOTODIODE WITH TIGHTLY-CONTROLLED JUNCTION PROFILE FOR CMOS IMAGE SENSOR WITH STI PROCESS

BACKGROUND OF THE INVENTION

1. Field of the Invention

The present invention relates to a photodiode for CMOS image sensor; more particularly, the invention relates to a method of forming a high performance photodiode with tightly-controlled junction profile for CMOS image sensor with STI (Shallow Trench Insolation) process.

2. Description of the Prior Art

Compared to charge coupled device (CCD) sensors, a CMOS image sensor has many advantages such as low voltage operation, low power consumption, compatibility with logic circuitry, random access, and low cost. Currently, the photodiode of a conventional CMOS image sensor is devised according to the following approaches: (1) N+/PW (or NPS/PW) is used for sensing high-intensity light because of inherent high dark current and low absorption rate; (2) NW/PSUB is used for sensing low-light and near red-light region. In particular, "N+" is a shorthand for N+ type junction, "PW" for P type well, "NPS" for N type pixel sensor, "NW" for N well, and "PSUB" for P substrate. Furthermore, most conventional pixel architectures convert the photo-charge to either a voltage or a current by placing the photo-charge onto a high impedance node such as the gate of a MOSFET. This high impedance node needs to be isolated from the rest of the pixel circuit, and this is usually done by a MOSFET switch. Off-current from that MOSFET switch thus appears as "dark current". However, the junction profile of the NW/PSUB cannot be easily controlled due to implantation through field oxide, especially for a shallow trench isolation (STI) process. Therefore, a high performance photodiode with variable junction profile per customer's requirement is useful for the manufacture of a CMOS image sensor.

FIGS. 1A and 1B are cross sectional views illustrating the steps involved in the process of forming a conventional NW/PSUB photodiode. This process begins by providing a p-type substrate 20 having a shallow trench isolation 22 readily formed. Referring to FIG. 1B, a n-well region 24 and a p-well region 26 is then doped, following the procedures of a standard CMOS process, by implanting phosphorus and boron ions into respective regions by the shallow trench isolation 22. Thus, the photodiode is constituted of at least a n-well region 24 doped in a p substrate 20. In this process, the junction profile of the n-well region 24 is controlled by a CMOS process which is not adjustable to meet various product's requirements.

SUMMARY OF THE INVENTION

In view of the above disadvantages, it is therefore an object of the present invention to provide a method of forming a high performance photodiode with tightly-controlled junction profile for CMOS image sensor with STI process.

According to the present invention, a method to fabricate a high performance photodiode includes at least the following steps. First, a p-type silicon substrate is provided as a base. Next, a pad oxide layer and thereon a nitride layer are sequentially formed on the surface of the substrate. Then, the nitride layer and the pad oxide layer are etched at the same time by means of a photolithography process to form a hard mask layer with a defined pattern. Further, a shallow trench is formed by an etching process using a photoresist layer and the hard mask layer as an etching mask for etching the substrate. Next, a wet or a dry thermal oxidation process is performed to form an oxide lining inside the shallow trench. A first thermal annealing process is performed. Then, a photoresist layer is formed over the nitride layer and the oxide lining. A n-well region is formed by defining a predetermined pattern on the photoresist layer through a photolithography process. The n-well region is doped with phosphorus by an ion-implanting process. In particular, the concentration of the phosphorus ions implanted varies depending on the requirement and specification of a product. Next, the photoresist layer is removed. A second thermal annealing process is performed to make the implanted ions uniformly diffused in the n-well region. Next, a silicon oxide layer is deposited on the substrate and to fill in the shallow trench completely. Then, excessive silicon oxide layer is removed from the surface of the substrate so that only the silicon oxide layer inside the shallow trench remains. Finally, the hard mask layer is removed, and a photodiode according to the present invention, which is a transistor, is thus formed on the substrate with tightly-controlled junction profile.

With the above process flow implemented, variable junction profile can be accomplished by adjusting such processing parameters as the concentration of the implanted ions, the annealing temperature, and the annealing time etc, to meet the specification and requirement of a CMOS image sensor product. The photodiode fabricated according to the method of the present invention has the advantage of bypassing a silicide process typically required in a conventional photodiode-fabricating process. Furthermore, the method of the present invention is also compatible with the standard method for fabricating logic devices. The high performance photodiode fabricated according to the method of the present invention also possesses low-leak junctions processed by a furnace annealing process without incurring any impact to the performance of the device.

BRIEF DESCRIPTION OF THE DRAWINGS

The following detailed description, given by way of examples and not intended to limit the invention solely to the scope of the embodiments described hereinafter, will best be understood in conjunction with the accompanying drawings, in which.

DETAILED DESCRIPTION OF THE PREFERRED EMBODIMENT

Accordingly, the present invention provides a method of fabricating a high performance photodiode with tightly-controlled junction profile for CMOS image sensor with STI (Shallow Trench Insolation) process.

The following embodiment of the present invention describes the fabricating method for forming a single photodiode of a CMOS image sensor in representation of all the other photodiodes on the same CMOS image sensor.

Figure 1A:
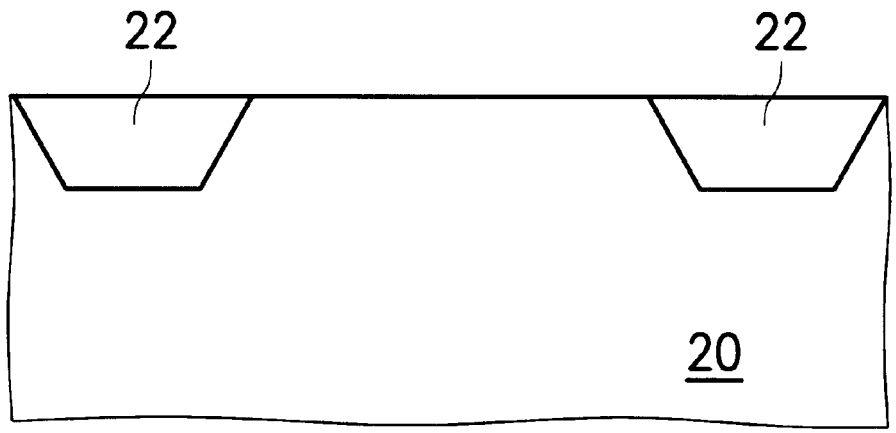
FIGS. 1A through 1B illustrate, in cross sectional views, the process steps according to the photodiode-fabricating method of a prior art.
Figure 1B:
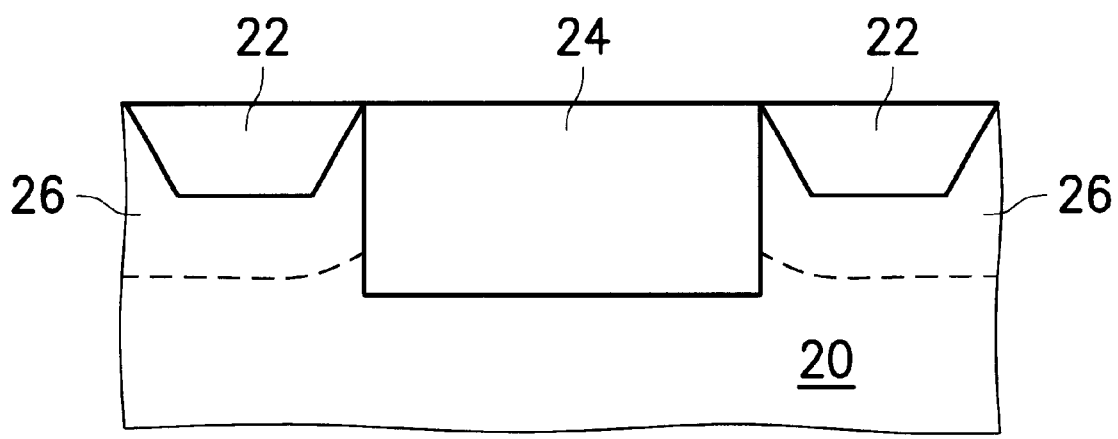
Figure 2A:
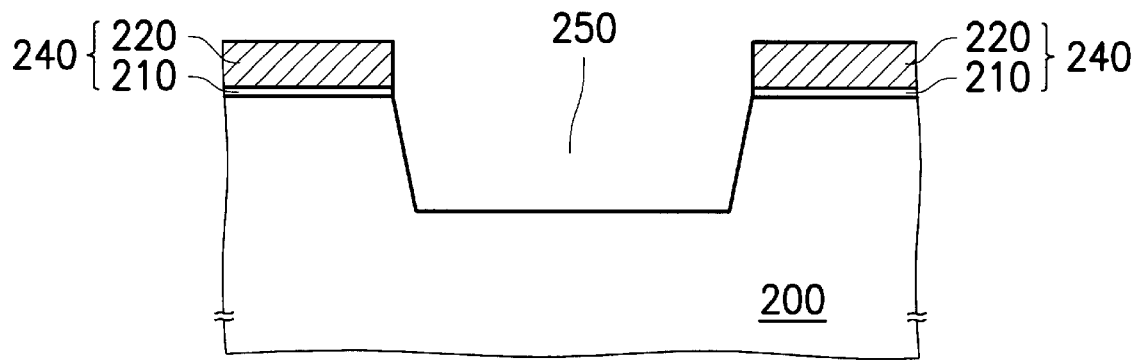
FIGS. 2A through 2E illustrate, in cross sectional views, the process steps according to the photodiode-fabricating method of the present invention.

Referring to FIG. 2A, a substrate 200 is provided, wherein the substrate 200 is preferably a p-type silicon substrate 200. Next, a pad oxide layer 210 and thereon a nitride layer 220 are sequentially formed on the substrate 200. The pad oxide layer 210 and the nitride layer 220 are preferably formed by means of a CVD (Chemical Vapor Deposition) process. Then, a photoresist layer (not shown) is formed on the nitride layer 220. A hard mask layer 240 is formed by defining a pre-determined pattern on the nitride layer 220 and the pad oxide layer 210 by means of a photolithography process. Then, a shallow trench 250 is formed in the substrate 200 by an etching process using the photoresist layer and the hard mask layer 240 as an etching mask for etching the substrate 200. For example, the substrate 200 may be anisotropically etched by a RIE (reactive ion etching) process. Next, the photoresist layer is removed. The result is shown in FIG. 2A.

Figure 2B:
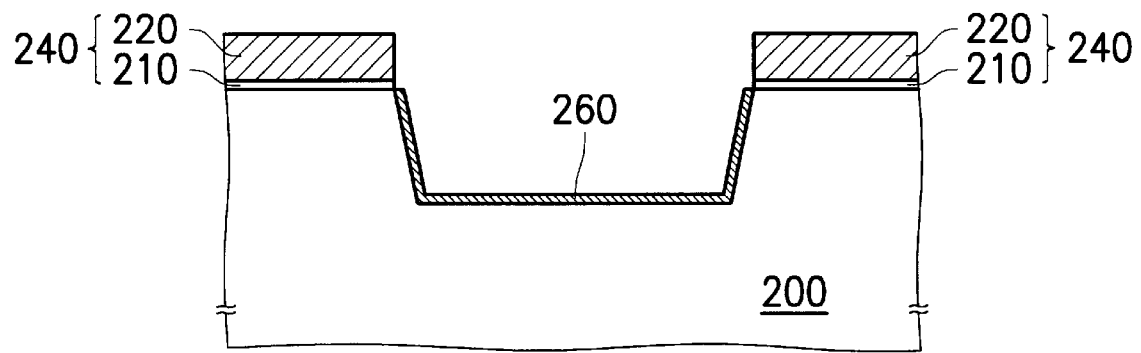

Referring to FIG. 2B, a wet thermal oxidation process is performed at a temperature of between 800° C. and 850° C. and with a oxygen/hydrogen gas ambient for forming an oxide lining 260 inside the shallow trench 250, or a dry thermal oxidation process at a temperature of between 900° C. and 950° C. and with a oxygen gas ambient can also be performed for achieving the same. During the oxidation process, the heated inner sidewalls and bottom side of the shallow trench 250 react with the oxygen molecules and form a layer of oxide lining 260. The oxide lining 260 preferably has a thickness in the range of between about 200 and 400 Å. A first thermal annealing process is performed at an ambient temperature of greater than 1000° C. in a nitrogen gas atmosphere. Through the thermal annealing process, the oxide lining 260 formed in the shallow trench 250 is strengthed by becoming more dense so as to improve the interfacial defects induced by the RIE and the oxidation processes. The first thermal annealing process is preferably performed at the temperature of 1100° C. in a nitrogen gas atmosphere for a time duration of about 2 hours.

Figure 2C:
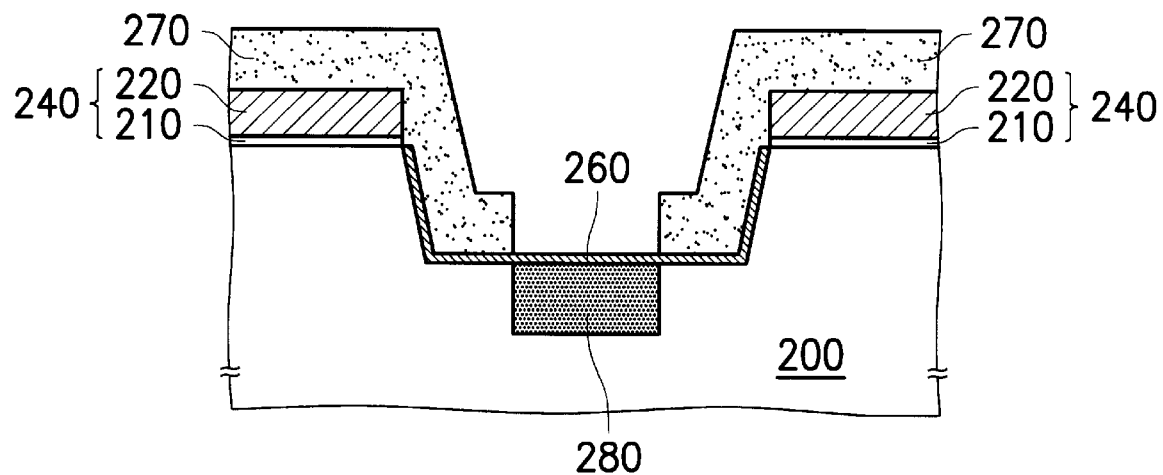

Referring to FIG. 2C, a photoresist layer 270 is coated over the exposed surfaces of the nitride layer 220 and the oxide lining 260. A n-well region 280 defined by the photoresist layer 270 is formed in the substrate 200 by means of a photolithography process. Then, the n-well region 280 is doped by implanting phosphorus ions at the temperature of 1100° C. The concentration of the phosphorus ions implanted varies depending on the requirement and specification of a product. Next, the photoresist layer 270 is removed. A second thermal annealing process is performed so as to make the implanted ions uniformly diffused in the n-well region 280 according to a pre-determined junction profile of the photodiode. Different junction profile of a photodiode can be accomplished by adjusting such processing parameters as the concentration of the implanted ions, the annealing temperature, and the annealing time etc, to meet the specification and requirement of a CMOS image sensor product. Also, the thermal annealing process improves the interfacial defects induced by the RIE and the oxidation processes.

Figure 2D:
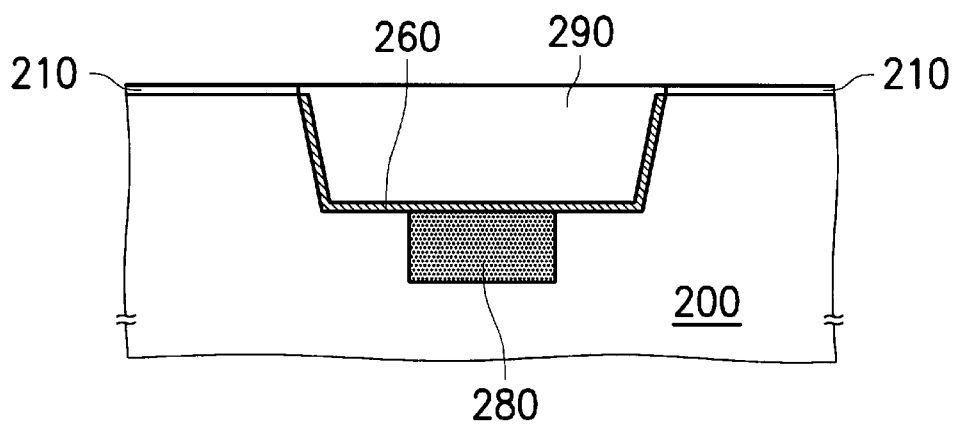
Figure 2E:
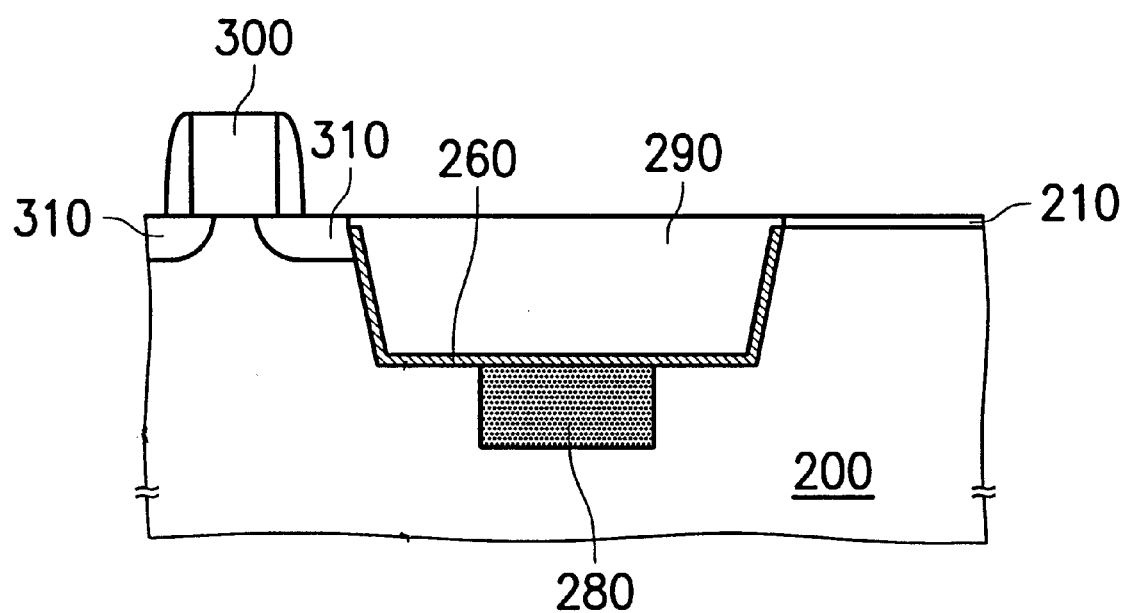

Referring to FIG. 2D, a silicon oxide layer 290 is deposited on the substrate 200 and to fill in the shallow trench 250 completely by means of a CVD process. Then, excessive silicon oxide layer 290 on the surface of the substrate 200 is removed so that only the silicon oxide layer 290 inside the shallow trench 250 remains. Finally, the hard mask layer 240 is removed, and a high performance photodiode comprised of a n-well region 280 formed in a p substrate 200 with tightly-controlled junction profile is thus formed according to the present invention. And then, a transistor such as an NMOS transistor comprising a gate structure 300, a source region 310 and a drain region 310, in a p-well region (not shown) as shown in FIG. 2E is formed.

While the invention has been particularly shown and described with reference to the preferred embodiments thereof, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A method of fabricating a high performance photodiode with tightly-controlled junction profile for CMOS image sensor with STI (Shallow Trench Isolation) process, comprising the steps of:

providing a p-type substrate;

forming a hard mask layer for defining a pattern on said p-type substrate;

etching said p-type substrate on the surface of the p-type substrate not covered by said hard mask layer to form a shallow trench;

growing an oxide lining in said shallow trench by a thermal oxidation process;

performing a first thermal annealing;

defining an n-well region in said shallow trench;

implanting said n-well region to form a photodiode composed of the n-well region and the p-type substrate; and performing a second thermal annealing.

2. The method as claimed in claim 1, wherein said substrate is a p-type silicon substrate.

3. The method as claimed in claim 1, wherein the forming of said hard mask layer comprises the steps of:

sequentially forming a pad oxide layer and thereon a nitride layer on said substrate; and forming said hard mask layer with a certain pattern in said nitride layer and said pad oxide layer by means of a photolithography process.

4. The method as claimed in claim 1, wherein the step of implanting said n-well region further comprises a step of implanting variable ion concentration depending on per product's requirement.

5. The method as claimed in claim 1, wherein, after performing said second thermal annealing, further comprising the steps of:

forming a silicon oxide layer on said substrate to fill in said shallow trench;

removing a portion of said silicon oxide layer on said substrate such that the portion in said shallow trench remains;

removing said hard mask layer; and forming a transistor on said substrate, wherein said transistor comprises a gate structure, a source region, and a drain region.

* * * * *